United States Patent [19]

Ogita

[11] 4,348,666
[45] Sep. 7, 1982

[54] SIGNAL LEVEL DISPLAY APPARATUS

[75] Inventor: Minoru Ogita, Hamamatsu, Japan

[73] Assignee: Nippon Gakki Seizo Kabushiki Kaisha, Hamamatsu, Japan

[21] Appl. No.: 160,844

[22] Filed: Jun. 19, 1980

[30] Foreign Application Priority Data

Jun. 20, 1979 [JP] Japan .............................. 54-84331[U]
Jul. 18, 1979 [JP] Japan .................................. 54-91306

[51] Int. Cl.³ .............................................. G09G 3/32
[52] U.S. Cl. .................................... 340/753; 315/168; 340/782; 340/793; 455/159
[58] Field of Search ................. 340/753, 754; 455/159

[56] References Cited

U.S. PATENT DOCUMENTS 3,969,672 7/1976 Wallander et al. .............. 340/753 X
4,039,956 8/1977 Shimanek et al. .............. 340/753 X
4,163,971 8/1979 Morin et al. ......................... 340/754

*Primary Examiner*—David L. Trafton
*Attorney, Agent, or Firm*—Cushman, Darby & Cushman

[57] ABSTRACT

A signal level display apparatus arranged so that an ac signal is superposed upon either an input signal or a reference voltage of a comparator to display the input signal with differences in degrees of brightness of illumination of light-emitting elements constituting a display unit when viewed externally, to thereby distinguish the level of the input signal which is closer to the level of the reference voltage from the level departing away therefrom. This apparatus also displays simultaneously on said display unit the level of two different input signals in distinguished degrees of illumination of the light-emitting elements.

19 Claims, 29 Drawing Figures

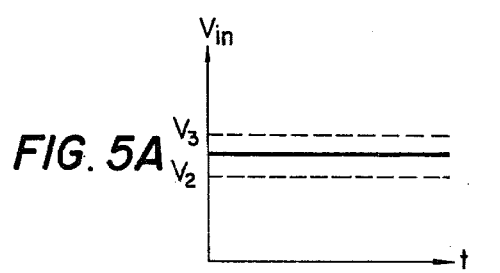
FIG. 5A
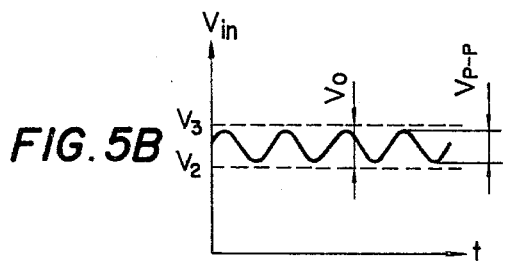
FIG. 5B
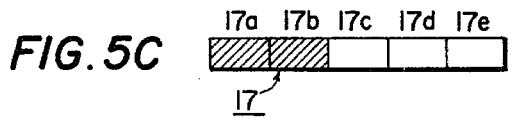
FIG. 5C
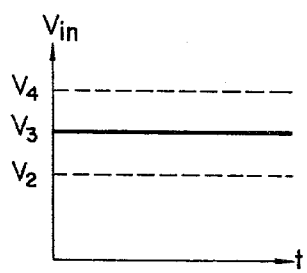
FIG. 6A
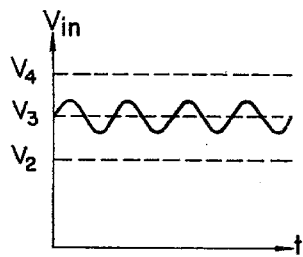
FIG. 6B
FIG. 6C
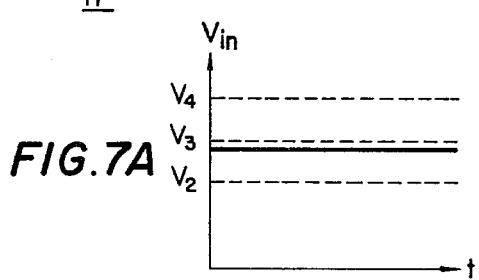
FIG. 7A
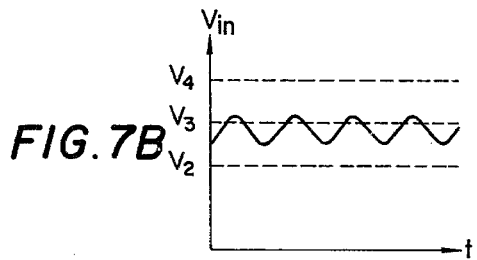
FIG. 7B
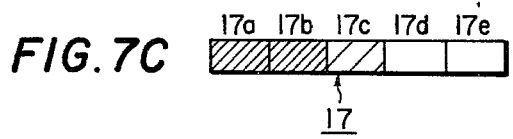
FIG. 7C

DETECTION SIGNAL OF IF SIGNAL LEVEL DETECTING CKT

OUTPUT OF LOW-PASS FILTER SUPPLIED TO POINT A (RECEIVED SIGNAL COMPONENT)

SIGNAL AT EMITTER OF TRANSISTOR 57 (MULTIPATH COMPONENT)

OUTPUT OF SWITCHING SIGNAL GENERATING CKT

SIGNAL AT POINT A

4,348,666

SIGNAL LEVEL DISPLAY APPARATUS

BACKGROUND OF THE INVENTION (a) Field of the Invention

The present invention relates to a signal level display apparatus for displaying, in bar chart style or in dots, the levels of input signals by a plurality of light-emitting elements.

(b) Description of the Prior Art

As devices for displaying the levels of various input signals, there have been known, in addition to known voltmeters and oscilloscopes, those display devices having a row of a plurality of light-emitting elements such as light-emitting diodes to make stepwise illuminating display of the levels of input signals in the form of either bar chart or dots. FIG. 1 shows an example of such known signal level display devices. The illustrated signal level display device is arranged so that the level of an input signal applied to an input terminal 1 is displayed in the form of a bar chart on a display unit 3 having five LEDs 3a to 3e arranged in a row and driven by a display driving means 2. The display driving means 2 has five comparators 4a to 4e to which are applied reference voltages $V_1$ to $V_5$ ($V_1 < V_2 < V_3 < V_4 < V_5$) as shown in FIG. 2. When an input signal voltage $V_{in}$ of, for example, $V_2 < V_{in} < V_3$ is applied to an input terminal 1, the potentials at the respective output terminals of the comparators 4a and 4b are rendered to zero level so that the LEDs 3a and 3b are lighted up. Here, the relationship between the illumination of these LEDs 3a to 3e and the input signal voltage $V_{in}$ is illustrated in FIG. 3.

The display device of this known type is designed so as to effect a display in stepwise mode in accordance with the level of the input signal. Accordingly, especially in case the level of the input signal lies at an intermediate value between the threshold values (i.e. the aforesaid voltages $V_1$ to $V_5$) of those LEDs representing the respective steps in the row, there arises the disadvantage that the level of the input signal cannot be displayed correctly.

SUMMARY OF THE INVENTION

It is, therefore, a primary object of the present invention to provide a signal level display apparatus arranged so that the level of an input signal is identified, when viewed, by the degree of brightness of luminescing light-emitting elements which are aligned in a row and actuated by a driver assigned for operation with a plurality of predetermined different reference voltages, whereby an input signal having an intermediate level lying between two adjacent reference voltages can be effectively displayed.

Another object of the present invention is to provide a signal level display apparatus of the type described above, in which said identification of a signal level by the degree of brightness of illumination of the light-emitting elements is achieved by an application of an ac bias voltage to the input signal requiring its level display.

Still another object of the present invention is to provide a signal level display apparatus of the type described above, in which said identification of a signal level by the degree of brightness of illumination of the light-emitting elements is achieved by an application of an ac bias voltage to the reference voltages of the driver of the light-emitting elements.

A further object of the present invention is to provide a signal level display apparatus of the type described above, which is capable of concurrently displaying, on a single display unit, the respective levels of two different input signals, by difference in degrees of brightnesses of luminescing light-emitting elements.

A still further object of the present invention is to provide a signal level display apparatus of the type described above, in which the signal level is displayed in bar chart style.

A further object of the present invention is to provide a signal level display apparatus of the type described above, in which the signal level is displayed in dots.

BRIEF DESCRIPTION OF THE DRAWINGS

FIGS. 5A to 5C are explanatory illustrations of an instance wherein LEDs provided in the circuit of FIG. 4 are caused to luminesce in full scale.

FIGS. 6A to 6C are explanatory illustrations showing the instance wherein a part of the LEDs in the circuit of FIG. 4 is lighted up with a brightness which is one half of the brightness of their full scale illumination.

FIGS. 7A to 7C are explanatory illustrations showing the instance wherein a part of LEDs in the circuit of FIG. 4 is lighted up with a brightness less than one half of the brightness of their full-scale illumination.

DETAILED DESCRIPTION OF THE PREFERRED EMBODIMENTS

Description will hereunder be made of some preferred embodiments of the present invention by referring to the accompanying drawings.

Figure 4:
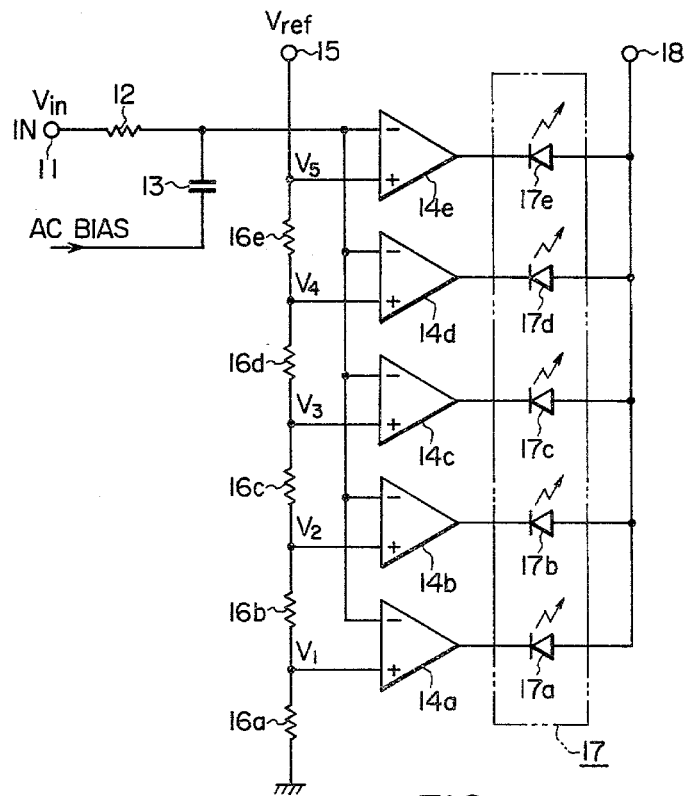
FIG. 4 is a circuit diagram of a first embodiment of the signal level display apparatus according to the present invention designed for bar chart display and of the type to superpose an ac bias voltage upon input signals.

FIG. 4 is a diagram showing a circuit arrangement of the signal level display apparatus according to a first embodiment of the present invention. In FIG. 4, upon an input signal applied through a resistor 12 to an input terminal 11 is superposed an ac bias signal supplied through a capacitor 13. The resulting input signal is supplied to each of first input terminals of comparators 14a to 14e each having a first and a second input terminal. Said ac bias signal may be any repetitive signal consisting of, for example, sinusoidal wave, triangular wave or sawtooth wave. Also, this ac bias signal may be selected to have an appropriate frequency such as a commercial frequency of 60 Hz, avoiding extreme low frequencies and high frequencies. The level of this ac bias signal will be described later. To the second input terminals of these comparators 14a to 14e are applied reference voltages $V_1$ to $V_5$ ($V_1 < V_2 < V_3 < V_4 < V_5$), respectively. These reference voltages $V_1$ to $V_5$ are formed by dividing a certain voltage $V_{ref}$ supplied to a terminal 15, by five resistors 16a to 16e each having an identical resistance value. Accordingly, between the respective reference voltages is established the following relation:

$$V_1 = V_2 - V_1 = V_3 - V_2 = V_4 - V_3 = V_5 - V_4 = V_0 \quad (1)$$

The respective outputs of the comparators 14a to 14e are supplied to the respective cathodes of LEDs 17a to 17e which jointly constitute a display unit 17. These LEDs 17a to 17e are arrayed in a row, and are intended to display, in a bar chart mode, the level of the input signal applied to the input terminal 11. To the respective anodes of the LEDs 17a to 17e is applied a positive voltage through a positive power supply terminal 18.

Description will next be made of the operation of the circuitry having the foregoing arrangement. Let us here assume that said ac bias signal is a sinusoidal ac signal having a peak-to-peak voltage value $V_{p-p}$ being of the relation $V_{p-p} < V_0$ (see Formula (1)). When a signal having an intermediate voltage $V_{in}$ whose level lies between the values of adjacent two reference voltages $V_2$ and $V_3$ shown in FIG. 5A is applied to the input terminal 11, this voltage $V_{in}$ is modified into such a signal as shown in FIG. 5B by being superposed with an ac bias signal which is supplied through the capacitor 13. The resulting signal is supplied to each one of the first input terminals of the respective comparators 14a to 14e. The instantaneous value of the signal shown in FIG. 5B always lies intermediate between the values of said reference voltages $V_2$ and $V_3$. Accordingly, the respective outputs of the comparators 14a and 14b are rendered to a zero level, whereas the respective outputs of the comparators 14c, 14d and 14e are rendered to a positive voltage level. This positive voltage level is at the level of the voltage of the positive power supply which is applied to the comparators 14a to 14e. As a result, LEDs 17a and 17b are rendered to their full luminescing state as shown in FIG. 5C. On the other hand, LEDs 17c, 17d and 17e are rendered to the non-luminescent state.

Next, in case the input signal having such voltage value $V_{in}$ as shown in FIG. 6A is applied to the input terminal 11, a signal shown in FIG. 6B is applied to each one of the first input terminals of the comparators 14a to 14e. The instantaneous value of this signal is always greater than the values of adjacent two reference voltages $V_1$ and $V_2$. Therefore, the respective outputs of the comparators 14a and 14b are rendered to the zero level, and the LEDs 17a and 17b are both rendered to their full luminescing state. On the other hand, the signals which are supplied to the first and second input terminals of the comparator 14c are such that their relative levels vary alternately with a cycle equal to the ac bias signal. Therefore, the output of this comparator 14c is switched alternately between the zero level and the positive voltage level with a cycle equal to the ac bias signal. It should be noted here that the period of time that the output is rendered to the zero level is equal to the period of time that the output turns to the positive voltage level. Accordingly, the LED 17c will repeat alternate illumination and non-illumination with the cycle. Accordingly, when this LED 17c is viewed with one's eyes, it will be visualized to be luminescent with a brightness which is one half of the brightness of its full illumination. In such instance, the LEDs 17d and 17e are rendered to non-luminescent state. The luminescent and non-luminescent state of the LEDs 17a to 17e are illustrated in FIG. 6C.

Also, in case the voltage of the input signal applied to the input terminal 11 is such as shown in FIG. 7A, a signal shown in FIG. 7B is applied to each one of the first input terminals of the comparators 14a to 14e. As a result, as shown in FIG. 7C, the LEDs 17a and 17b are fully lighted up, whereas the LED 17c is viewed to be lighted up with a brightness still less than that shown in FIG. 6C, and the LEDs 17d and 17e do not luminesce.

Figure 1:
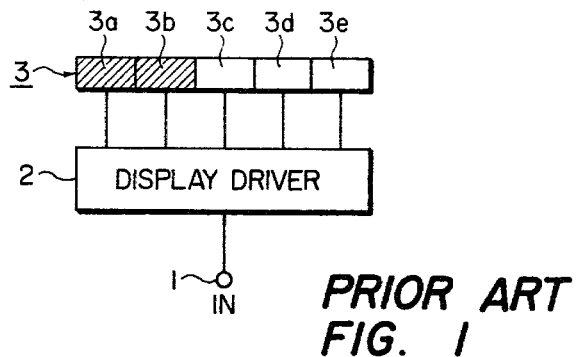
FIG. 1 is a block diagram showing an example of a known signal level display device designed to make a stepwise display in bar chart style.
Figure 2:
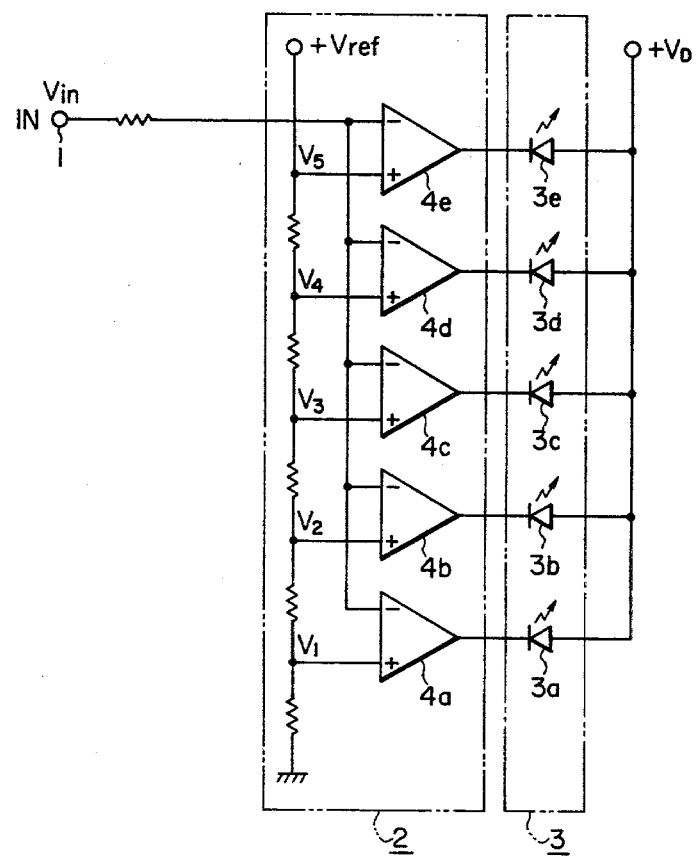
FIG. 2 is a circuit diagram showing the details of the circuitry of the known display device shown in FIG. 1.
Figure 3:
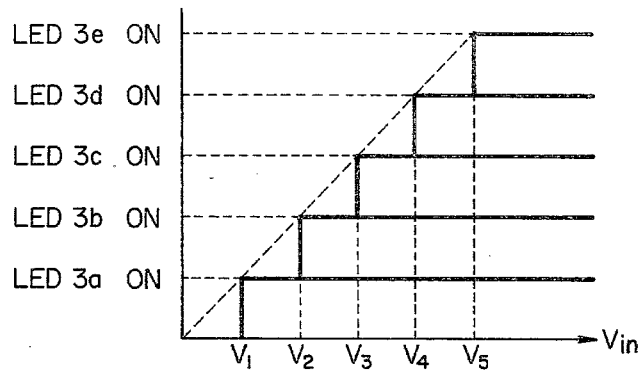
FIG. 3 is a display characteristic chart of the known display device shown in FIG. 1.
Figure 8:
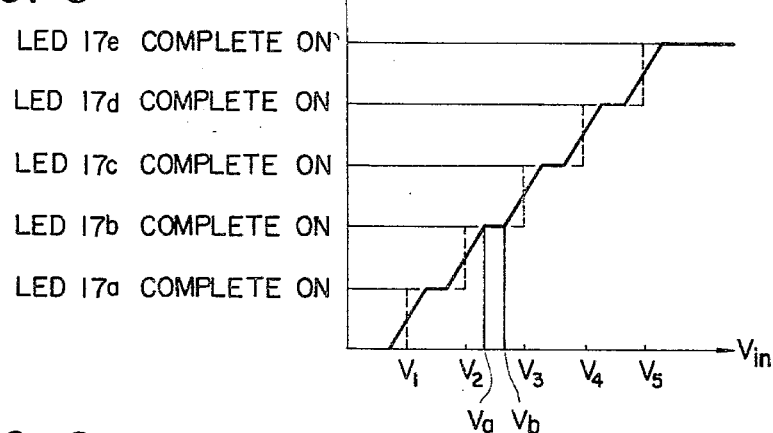
FIGS. 8 to 10 are display characteristic charts of instances wherein the level of ac bias applied to an input signal in the circuitry of FIG. 4 is varied.

As stated above, the circuitry shown in FIG. 4 is operative in such way that, even when the voltage $V_{in}$ of the input signal is of a value lying intermediate of the values of any adjacent two of the reference voltages $V_1$ to $V_5$, the voltage level of this input signal can be displayed by virtue of difference in the degrees of brightness of illumination of the LEDs 17a to 17e which are caused to luminesce in correspondence to the voltage level of the input signal applied. The display characteristic in case the peak-to-peak value $V_{p-p}$ of the above-said ac bias signal has the relationship $V_{p-p} < V_0$ is shown in FIG. 8. In this Figure, the broken line indicates the display characteristic shown in FIG. 3 of the known display device. This FIG. 8 shows the mode of display such that, in case the level of the voltage $V_{in}$ of the input signal is at value $V_a$, the LEDs 17a and 17b are fully lighted up, and in case this input signal voltage level lies intermediate between value $V_a$ and value $V_b$, this illuminating condition continues, whereas when the input signal voltage level has gained value $V_b$, the LED 17c begins to luminesce.

Figure 9:
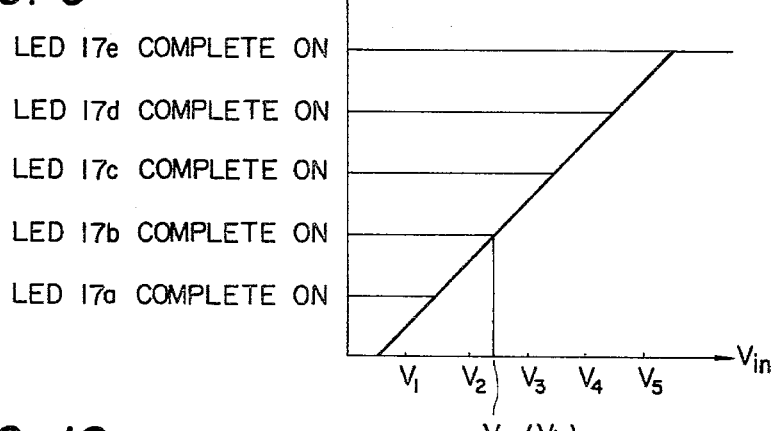

Next, the display characteristic in case the peak-to-peak value $V_{p-p}$ of the ac bias signal is of the relationship $V_{p-p} = V_0$ is shown in FIG. 9. In such instance, in case the level of the voltage $V_{in}$ of the input signal has, for example, value $V_a$ which is intermediate between $V_2$ and $V_3$ the LEDs 17a and 17b are fully lighted up, and concurrently therewith the LED 17c begins to luminesce. Accordingly, the display characteristaic assumes a linear pattern as shown.

Figure 10:
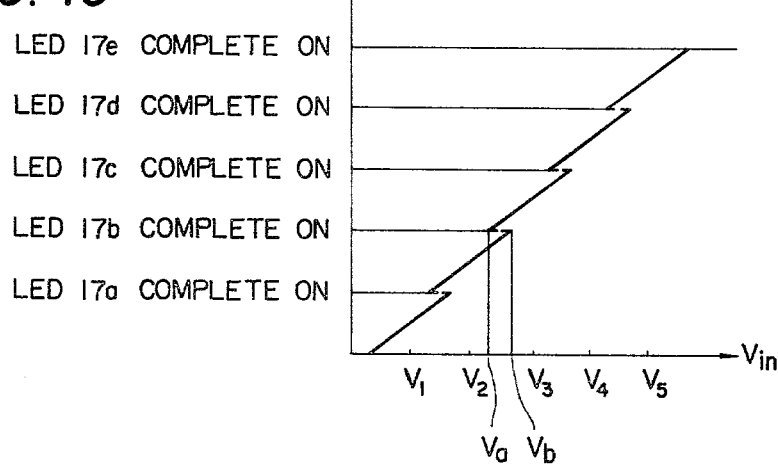

FIG. 10 shows the display characteristic in case the peak-to-peak value $V_{p-p}$ of the ac bias signal is of the relationship $V_{p-p} > V_0$. In this instance, when the level of the voltage $V_{in}$ of the input signal takes the value $V_a$, the LED 17c begins to luminesce before the LED 17b is fully lighted up, so that the display characteristic will be of a folding pattern as shown.

Figure 11:
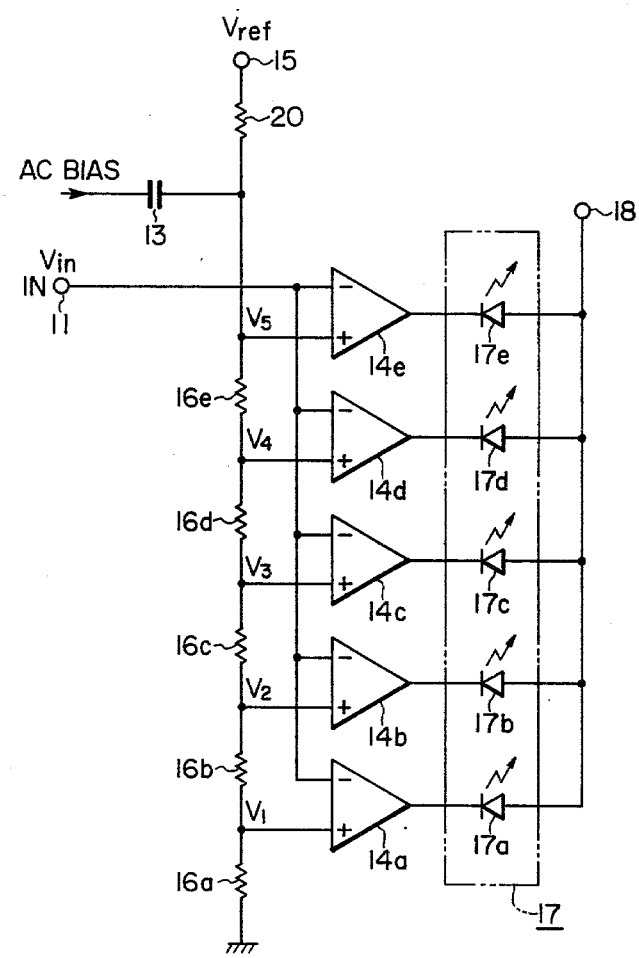
FIG. 11 is a circuit diagram of a second embodiment of the signal level display apparatus of the present invention designed to make a bar chart mode display wherein an ac bias is applied to the reference voltages supplied to comparators.

FIG. 11 shows the circuit arrangement of a second embodiment of the signal level display apparatus of the present invention. In this Figure, like parts corresponding to those of the circuitry shown in FIG. 4 are given like reference numerals and symbols. The circuitry shown in FIG. 11 is similar to that of FIG. 4 except that a resistor 20 is inserted between a terminal 15 and a resistor 16e, and that an ac bias signal is supplied to a connecting point of said resistor 20 and resistor 16e. That is, in the circuitry of FIG. 11, the ac bias signal is not superposed upon the input signal, but it is superposed upon each of reference voltages $V_1$ to $V_5$. In this instance also, an input voltage applied to each one of first input terminals of comparators 14a to 14e and the reference voltages applied respectively to second input terminals of the comparators alternate relatively with the cycle of the ac bias signal applied to the reference voltages. Accordingly, this embodiment provides exactly the same effect as that obtained from the circuitry shown in FIG. 4.

Figure 12:
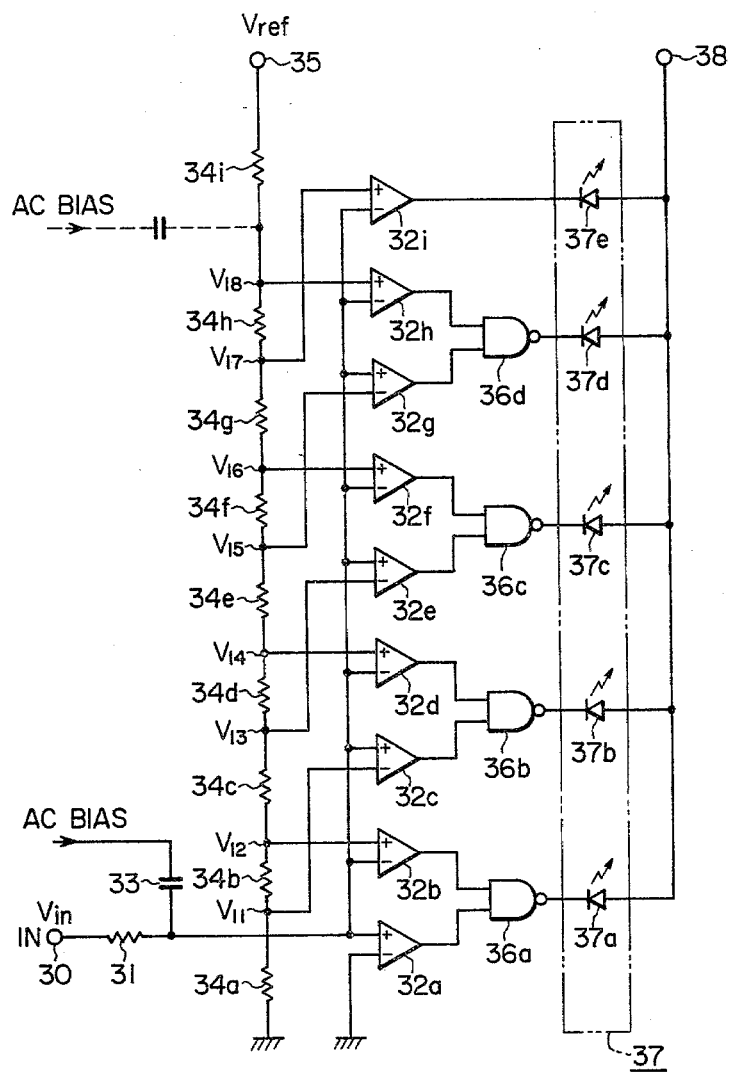
FIG. 12 is a circuit diagram showing a third embodiment of the signal level display apparatus of the present invention designed for display in dots.

FIG. 12 shows a third embodiment of the present invention. The signal level display circuitry shown here employs a dot-display mode instead of the bar chart display mode of the preceding first and second embodiments, i.e. by the luminescing of only those related LEDs. More particularly, in FIG. 12, an input signal applied to an input terminal 30, after passing through a resistor 31, is superposed upon an ac bias signal supplied through a capacitor 33. The resulting signal is applied to each of the first input terminals of the comparators 32a, 32c, 32e and 32g, and also is applied to each of the second input terminals of the comparators 32b, 32d, 32f, 32h and 32i. Also, to said second input terminals of the comparators 32a, 32c, 32e and 32g are applied a ground potential, reference voltages $V_{11}$, $V_{13}$ and $V_{15}$, respectively. To each of the first input terminals of the comparators 32b, 32d, 32f, 32h and 32i are applied reference voltages $V_{12}$, $V_{14}$, $V_{16}$, $V_{18}$, and $V_{17}$, respectively. These reference voltages $V_{11}$ to $V_{18}$ ($V_{11} < V_{12} < V_{13} < V_{14} < V_{15} < V_{16} < V_{17} < V_{18}$) are each formed by dividing a certain voltage $V_{ref}$ supplied to the terminal 35 by resistors 34a to 34i, respectively (the resistor 34a has a resistance value 2R, and the resistors 34b to 34i each have a resistance value R). That is, these respective reference voltages are of the relationship: $V_{11}/2 = V_{12} - V_{11} = V_3 - V_{12} = V_{14} - V_{13} = V_{15} - V_{14} = V_{16} - V_{15} = V_{17} - V_{16} = V_{18} - V_{17} = V_0$. The respective outputs of the comparators 32a and 32b are supplied to a NAND gate 36a, and the respective outputs of the comparators 32c and 32d are supplied to a NAND gate 36b, and the respective outputs of the comparators 32e and 32f to a NAND gate 36c, and the respective outputs of the comparators 32g and 32h to a NAND gate 36d, respectively. The respective outputs of the NAND gates 36a to 36d and of the comparator 32d drive the LEDs 37a to 37e which jointly constitute a display unit 37. Also, to the respective anodes of the LEDs 37a to 37e is applied a positive voltage from a positive power supply terminal 38. In this way, a set of window comparators is constructed by, for example, comparators 32a and 32b and a NAND gate 36a.

Figure 13:
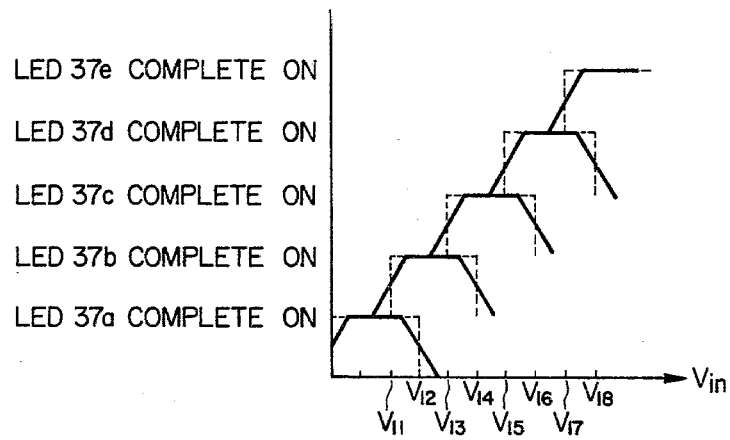
FIG. 13 is a display characteristic chart of the circuitry shown in FIG. 12.

In the above-stated arrangement, let us here assume that the ac bias signal is a sinusoidal ac signal whose peak-to-peak voltage $V_{p-p}$ has the relationship, for example, $V_{p-p} < 2V_0$. In such instance, the display characteristic will become as shown in FIG. 13. In this Figure, the broken lines indicate the display characteristic obtained from known display device intended for display in dots. It should be understood here that, in the signal level display circuitry shown in FIG. 12 also, it is possible to perform a display of input signal level by the brightnesses of LEDs 37a to 37e in much the same way as in the preceding first and second embodiments. Also, by varying the value of the peak-to-peak voltage $V_{p-p}$ of the ac bias signal, it is possible to vary the display characteristic. Furthermore, the ac bias signal may be applied to the connecting point of the resistors 34h and 34i as shown by a broken line in FIG. 12. In such instance, however, the ac bias signal will be superposed respectively upon the reference voltages $V_{11}$ to $V_{18}$. In each of the above-mentioned embodiments, five LEDs are used. LEDs are not limited to five in number. The display unit may be constructed with an increased number of LEDs.

The first to the third embodiments described above are arranged so that, by superposing an ac bias signal upon either an input signal or reference voltages, the difference in level between the input signal and the reference voltage is displayed, thereby giving the viewer the impression as if the LEDs are luminescing with different degrees of brightness, making it possible to provide exact identification of the level of the input signal applied.

Description will next be made of an instance wherein the respective levels of two different input signals are displayed concurrently in an identifiable manner by a single display apparatus, based on the above-described principle of illuminations of LEDs with different degrees of brightness.

Figure 14:
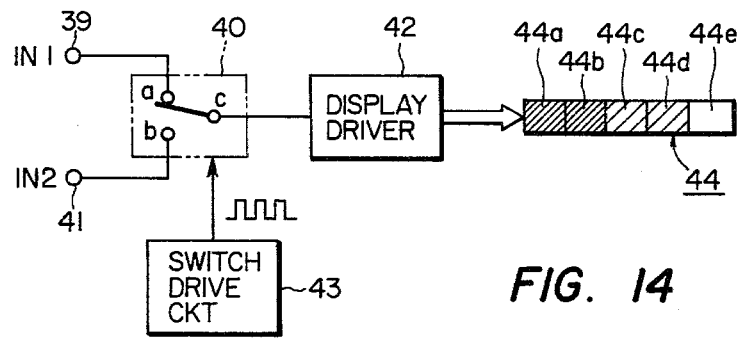
FIG. 14 is a block diagram showing an outline of a fourth embodiment of the signal level display apparatus of the present invention designed for displaying concurrently two different input signal levels in a bar chart mode by a signal display apparatus.

FIG. 14 is a block diagram showing an outline of such instance. In this Figure, an input terminal 39 is connected to a terminal a of a switch means 40, and an input terminal 41 is connected to terminal b of this switch means 40. In practice, the switch means 40 is comprised of an analog switch. However, it is illustrated by a mechanical switch for the convenience of understanding. This switch means 40 is arranged to perform high-speed changeover action by an output pulse of a frequency of, for example, 60 Hz delivered from a switch driver circuit 43. A signal derived at a common terminal c of the switch means 40 is applied to an input terminal of a display driver circuit 42. This display driver circuit 42 is assigned to drive a display unit 44 formed with a row of five LEDs 44a to 44e, in accordance with a signal supplied to the input terminal of the display driver circuit.

Figure 15A:
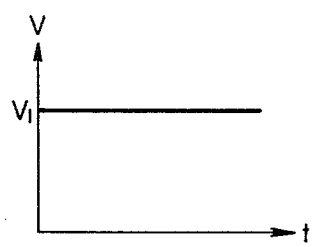
FIGS. 15A and 15B are charts showing examples of input signals whose levels are to be displayed.
Figure 15B:
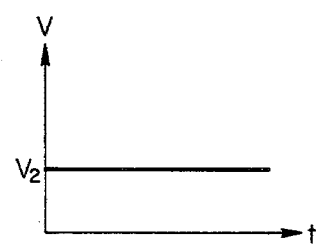

In the circuitry having the foregoing arrangement, let us assume that input signals as shown in FIGS. 15A and 15B are supplied to the input terminals 39 and 41, respectively. The input signal shown in FIG. 15A is one which, when this signal alone is supplied directly to the input terminal of the display driver circuit 42, will cause LEDs 44a to 44d to luminesce with a degree of brightness which is one half of their full illumination. Also, the input signal shown in FIG. 15B is one which, in case this signal alone is directly supplied to the input terminal of the display driver circuit 42, will cause LEDs 44a and 44b to luminesce with similar half degree of brightness. When these two input signals are applied simultaneously to the two input terminals 39 and 41, and when concurrently a pulse signal having a frequency of 60 Hz and a duty cycle of 50% is applied to the switch means 40 from the switch driver circuit 43, a signal shown in FIG. 15A and a signal shown in FIG. 15B are alternately supplied repetitively to the input terminal of the display driver circuit 42 with a time interval of 1/120 sec. As a result, the LEDs 44a and 44b are driven always, i.e. these LEDs are driven by each of these signals shown in FIGS. 15A and 15B. Accordingly, these LEDs 44a and 44b are fully lighted up, whereas the LEDs 44c and 44d are driven by a pulse having a duty of 50, i.e. these two LEDs are driven only by the signal shown in FIG. 15A. Accordingly, these two LEDs 44c and 44d are viewed to be lighted up with a half degree brightness. Thus, by making use of the difference in the degree of brightness of illumination between the LEDs 44a and 44d, it is possible to perform simultaneous display of the levels of the two input signals shown in FIGS. 15A and 15B on the single display unit 44.

Figure 16:
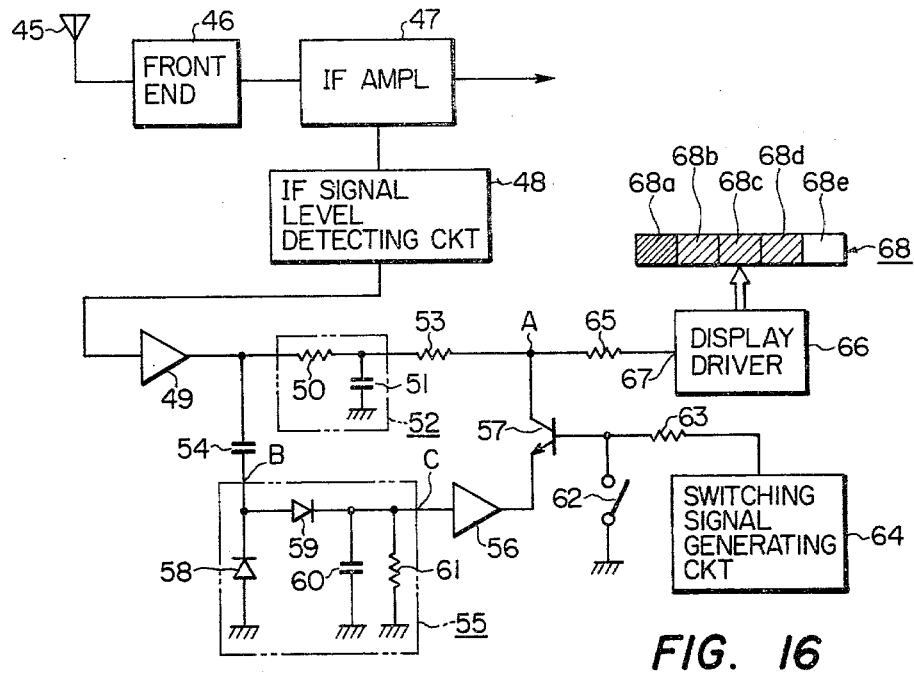
FIG. 16 is a block diagram, showing an instance wherein the embodiment of FIG. 14 is applied to an FM receiver to concurrently display both the level of an input signal component and the level of a multipath component.
Figure 17:
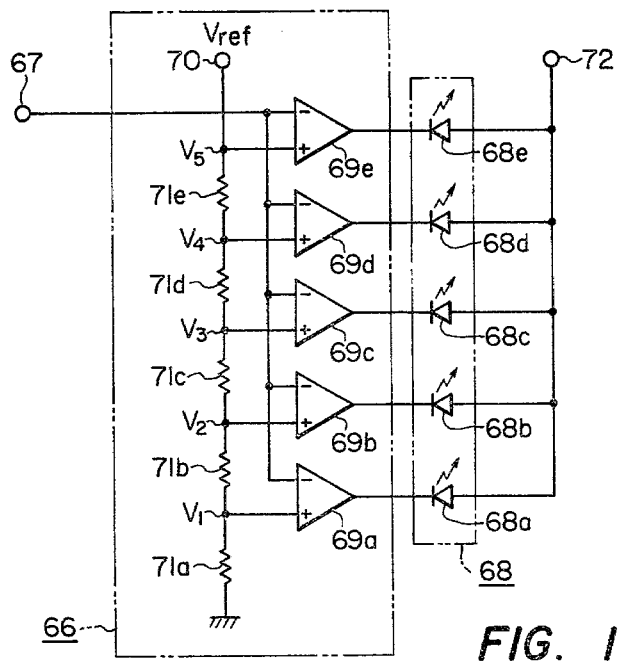
FIG. 17 is a circuit diagram showing the details of the display driver circuit and the display unit shown in FIG. 16.

Next, the embodiment of the present invention shown in FIG. 14 will be described in further detail by referring to FIGS. 16 to 18. FIG. 16 shows display circuitry representing an instance wherein the present invention is applied to an FM receiver, so that the level of the signal component received and the level of multipath component can be displayed concurrently on a single display unit. In the circuit arrangement shown, an FM signal which contains multipath component and which is received by an antenna 45 is subjected to high frequency amplification by a front end section 46 and is converted to an intermediate frequency signal, and is supplied to an intermediate frequency amplifying circuit 47 for intermediate frequency amplification, to be delivered to a subsequent circuit. The abovesaid signal-passing course is one which is usually employed in FM receivers, so that its explanation is omitted. Therefore, description will hereunder be made of a circuit arrangement intended for concurrently displaying, on a single display unit, both levels of the received signal component and the multipath component.

The output of the intermediate frequency (IF) amplifying circuit 47 is delivered to an IF signal level detecting circuit 48. This circuit 48 is arranged to rectify and smooth an IF signal which contains multipath components and to thereby remove IF carrier components, to thereby generate a detection signal containing a dc component corresponding to the received signal component, and also an ac component corresponding to the multipath component. This detection signal is delivered to an input terminal of a buffer amplifier 49. The signal containing the aforesaid dc component and ac component and being derived at an output terminal of this buffer amplifier 49 is passed through a low-pass filter 52 which is composed of a resistor 50 and a capacitor 51, to thereby extract only the dc component. The extracted dc component is delivered to Point A shown in FIG. 16 via a resistor 53.

On the other hand, the ac component derived at the output terminal of the buffer amplifier 49 is input to a detecting circuit 55 via a capacitor 54 intended for cutting the dc component. Thereafter, this ac component is supplied to an emitter of a switching transistor 57 via a buffer amplifier 56. This detecting circuit 55 has its input terminal B connected to a cathode of a diode 58 and also to an anode of a diode 59. The anode of the diode 58 is grounded. The cathode of the diode 59 is connected to an output terminal C. Between this output terminal C and ground are connected a capacitor 60 and a resistor 61. The base of said transistor 57 is grounded via a changeover switch 62, and further is connected to an output terminal of a switching signal generating circuit 64 via a resistor 63. The collector of the transistor 57 is connected to said Point A. The switching signal generating circuit 64 is intended to generate a pulse signal, i.e. switching signal, to cause on-off actions of the transistor 57 at a high speed. This pulse signal may be any arbitrary alternating current signal of, for example, sinusoidal wave, triangular wave, sawtooth wave and rectangular wave. In this embodiment, this pulse signal is obtained by dividing the voltage of the commercial power source. The signal derived at Point A is delivered to an input terminal 67 of a display driver circuit 66 via a resistor 65. An output of this display driver circuit 66 drives a display unit 68 which is comprised of a row of five LEDs 68a to 68e.

Description will next be made of the display driver circuit 66. FIG. 17 is a circuit diagram showing the arrangement of such display driver circuit 66. A signal input to an input terminal 67 is delivered to the respective inverting input terminals of comparators 69a to 69e. On the other hand, a certain voltage $V_{ref}$ supplied to a terminal 70 is divided by five resistors 71a to 71e having an identical resistance value. The resulting reference voltages $V_1$ to $V_5$ are supplied to the respective non-inverting input terminals of the comparators 69a to 69e, respectively. In this instance, the relationship between the respective reference voltages are:

$$V_1 = V_2 - V_1 = V_3 - V_2 = V_4 - V_3 = V_5 - V_4, \text{ and}$$
$$V_5 = V_{ref}.$$

Those signals derived at the respective output terminals of the comparators 69a to 69e are supplied to the respective cathodes of LEDs 68a to 68e which constitute a display unit 68. To the respective anodes of these LEDs 68a to 68e is supplied a positive voltage via a positive power supply terminal 72.

Next, description will be made of the operation of the circuitry shown in FIGS. 16 and 17, by referring to the waveshapes shown in FIGS. 18A to 18E.

Figure 18A:
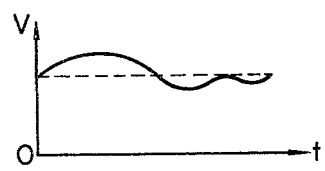
FIGS. 18A to 18E are waveshape charts showing the signal waveshapes at the respective sections of the apparatus shown in FIG. 16.
Figure 18B:
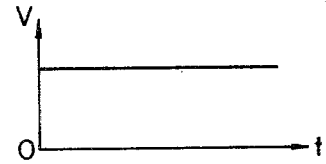

In FIG. 16, the received signal component and the multipath component which are detected by the IF signal level detecting circuit 48 are supplied, as the detection signal such as shown in FIG. 18A containing a dc component corresponding to the received signal component and an ac component corresponding to the multipath component, to the low-pass filter 52 and the capacitor 54 via the buffer amplifier 49. The dc component contained in the detection signal is extracted by the low-pass filter 52, and this dc component is supplied, as a signal shown in FIG. 18B, to Point A via the resistor 53. Also, the ac component contained in the detection signal is supplied to the detection circuit 55 via the capacitor 54, and thereafter this ac component is delivered, as a signal shown in FIG. 18C, to the emitter of the transistor 57 via the buffer amplifier 56.

Figure 18C:
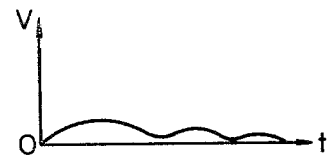
Figure 18D:
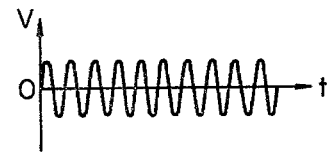
Figure 18E:
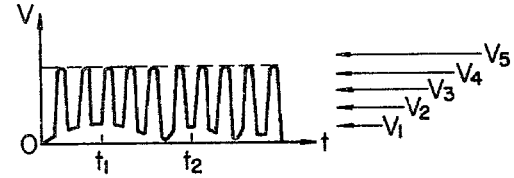

In case the output of the circuit 64 for generating a switching signal having a waveshape shown in FIG. 18D exceeds a potential $V_p$ which is higher by about 0.6 volt than the potential at the output terminal of the buffer amplifier 56, i.e. higher than the potential shown in FIG. 18C, the transistor 57 is rendered conductive. Because the buffer amplifier 56 has a low output impedance, the potential at Point A will be equal to the potential level at the output terminal of said buffer amplifier 56. In such instance, the changeover switch 62 is open. In case the output of the switching signal generating circuit 64 is negative or is lower than said potential $V_p$, the transistor 57 is rendered non-conductive. Therefore, the potential at Point A will become equal to the output voltage of the low-pass filter 52. That is, in case the output shown in FIG. 18D of the switching signal generating circuit 64 is applied to the base of the transistor 57, the signal derived at Point A will become as shown in FIG. 18E.

Description will next be made of the instance wherein the signal derived at Point A is delivered, via the resistor 65, to the input terminal 67 of the display driver circuit 66 shown in FIG. 17.

This signal is delivered to the respective inverting input terminals of the comparators 69a to 69e for comparison with the respective reference voltages $V_1$ to $V_5$ which are supplied to the non-inverting input terminals of these comparators. Let us here assume that these reference voltages $V_1$ to $V_5$ are set, in advance, as shown in FIG. 18E. Since the reference voltage $V_5$ is always greater than the level of signal derived at Point A, the output of the comparator 69e will always assume a positive potential, i.e. a potential equal to the positive power supply voltage supplied to this comparator 69e. Accordingly, the LED 68e will always remain non-illuminating. Also, since the signal derived at Point A and the respective reference voltages $V_4$, $V_3$, $V_2$ alternately vary in the magnitude of their levels repetitively, the outputs of the comparators 69d, 69c and 69b will alternately shuttle between the positive potential and the ground potential at a duty cycle of about 50%. Accordingly, the LEDs 68d, 68c and 68b will be visualized as being half-illuminating. Because the signal at Point A becomes greater in level than the reference voltage $V_1$ in the vicinity of time $t_1$ or $t_2$ shown in FIG. 18E, the output of the comparator 69a will assume ground potential. However, at those times other than those mentioned above shown in FIG. 18E, the output of the comparator 69a will repeat shuttling between the ground potential and the positive potential at a duty cycle of about 50%. Accordingly, the LED 68a will be viewed as illuminating in full scale in the vicinity of time $t_1$ or $t_2$, and furthermore at other times, it will be viewed as half-illuminating. That is, in case the level of the multipath component signal shown in FIG. 18C exceeds the reference voltage $V_1$, the LED 68a is viewed as fully illuminating, and in case this level is lower than the reference voltage $V_1$, it is viewed as half-illuminating.

In a manner as described above, the detection signal shown in FIG. 18A of the IF signal level detecting circuit 48 is such that its dc component, i.e. the received signal component, is displayed by what is visualized to be half-illumination of the LEDs 68b to 68d, and its ac component, i.e. multipath component, is displayed by alternate repetition of full illumination and half-illumination of the LED 68a. Whereby, it is possible to provide for being observed, at the same time, both of the received signal level and the amount of disturbance by multipath transmission on the single display unit 68. Thus, in case it is intended to adjust the signal receiving environment such as the direction or position of the antenna of the receiver to an optimum receiving condition, such adjustment can be performed easily by observing, at the same time, both the received signal level and the amount of multipath disturbance on the display unit 68.

It should be understood here that when the changeover switch 61 in FIG. 16 is closed, the transistor 57 is forcibly turned off, so that only the output of the low-pass filter 52 is displayed on the display unit 68.

In the above-described embodiment, the display unit 68 is formed with five LEDs 68a to 68e. However, by increasing the number of LEDs, it is possible to perform a more exact display of the signal levels.

Also, in the above-stated embodiment, the duty cycle of the output signal of the switching signal generating circuit 64 is set at 50%. However, by varying the duty cycle of this output signal, it is possible to vary the degrees of brightnesses of said half-illumination of the LEDs.

What is claimed is:

1. In a signal level display apparatus comprising:
a plurality of comparators having two input terminals respectively for receiving at one of the two input terminals mutually different reference voltages respectively, and at the other input terminals a same input signal; and a plurality of light-emitting elements driven separately by outputs of said comparators and forming a display unit,
the improvement comprising:
means for varying, with time and repetitively, the relative magnitudes of one of said input signal and said reference voltages so as to cause differences in brightness of illumination between said light-emitting elements.

2. A signal level display apparatus according to claim 1, in which said means for varying, with time and repetitively, the relative magnitudes of one of said input signal and said reference voltages is comprised of means for varying the level of the input signal.

3. A signal level display apparatus according to claim 2, in which said means for varying the level of the input signal is comprised of means for superposing an ac signal upon the input signal.

4. A signal level display apparatus according to claim 1, in which said means for varying, with time and repetitively the relative magnitudes of one of said input signal and said reference voltages is comprised of means for varying the levels of the reference voltages.

5. A signal level display apparatus according to claim 4, in which said means for varying the levels of the reference voltages is comprised of means for superposing an ac signal upon the reference voltages.

6. A signal level display apparatus according to claim 3 or 5, in which said ac signal is a commercial frequency signal.

7. A signal level display apparatus according to claim 2, in which said varying means is comprised of means for providing said comparators with the input signal and a certain potential alternately.

8. A signal level display apparatus according to claim 7, in which said potential is a circuit ground potential, whereby displaying the level of said input signal in decreased brightness of illumination of said light-emitting elements.

9. A signal level display apparatus according to claim 7, in which said potential is a voltage potential given by a level of a second input signal,
whereby displaying both levels of said first and second input signals concurrently in such a manner that the level of said first input signal is displayed in decreased brightness of illumination of said light-emitting elements and the level of said second input signal is displayed in full brightness of illumination of said light-emitting elements.

10. A signal level display apparatus according to claim 7, in which said alternately providing means is comprised of a switching means adapted to effect changeover action by a switching signal.

11. A signal level display apparatus according to claim 10, in which said switching means is a transistor.

12. A signal level display apparatus according to claim 10, in which said switching signal is a commercial frequency signal.

13. A signal level display apparatus according to claim 9, in which said second input signal is one representing a characteristic of said first input signal and is extracted from the first input signal.

14. A signal level display apparatus according to claim 13, in which said first input signal is a received signal component in an FM receiver, and said second input signal is a multipath component in said FM receiver.

15. A signal level display apparatus according to claim 14, in which said received signal component is an IF signal component.

16. A signal level display apparatus according to claim 6, in which said plurality of comparators are the same in number as said plurality of light-emitting elements, and said light-emitting elements display the input signal in bar chart fashion.

17. A signal level display apparatus according to claim 6, two of said plurality of comparators constituting a set of window comparators along with a NAND gate means, and one of said plurality of light-emitting elements being assigned to said set of window comparators to display the input signal in dot fashion.

18. A signal level display apparatus according to any one of claims 7 to 15, in which said plurality of comparators are the same in number as said plurality of light-emitting elements, and said light-emitting elements display the input signal in bar chart fashion.

19. A signal level display apparatus according to any one of claims 7 to 15, two of said plurality of comparators constituting a set of window comparators along with a NAND gate means, and one of said plurality of light-emitting elements being assigned to said set of window comparators to display the input signal in dot fashion.

* * * * *